United States Patent
Emani

(10) Patent No.: US 10,921,793 B2
(45) Date of Patent: *Feb. 16, 2021

(54) SUBSTRATE ROUTING AND THROUGHPUT MODELING

(71) Applicant: Applied Materials, Inc., Santa Clara, CA (US)

(72) Inventor: Shyam Sunder Emani, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/518,939

(22) Filed: Jul. 22, 2019

(65) Prior Publication Data

US 2020/0012267 A1 Jan. 9, 2020

Related U.S. Application Data

(63) Continuation of application No. 15/706,209, filed on Sep. 15, 2017, now Pat. No. 10,359,769.

(51) Int. Cl.
*G05B 19/418* (2006.01)
*H01L 21/67* (2006.01)
*H01L 21/28* (2006.01)

(52) U.S. Cl.
CPC . *G05B 19/41885* (2013.01); *G05B 19/41865* (2013.01); *H01L 21/67167* (2013.01);
(Continued)

(58) Field of Classification Search
None
See application file for complete search history.

(56) References Cited

U.S. PATENT DOCUMENTS

| 5,928,389 A | 7/1999 | Jevtic |
| 5,975,740 A | 11/1999 | Lin et al. |

(Continued)

FOREIGN PATENT DOCUMENTS

| TW | 201711089 A | 3/2017 |
| TW | 201712447 A | 4/2017 |

OTHER PUBLICATIONS

Office Action from Taiwan Patent Application No. 107132352 dated Jul. 11, 2019.

(Continued)

*Primary Examiner* — Ryan A Jarrett
(74) *Attorney, Agent, or Firm* — Patterson + Sheridan, LLP

(57) ABSTRACT

Embodiments disclosed herein generally relate to methods, systems, and non-transitory computer readable medium for scheduling a substrate processing sequence in an integrated substrate processing system. A client device assigns a processing sequence to each substrate in a batch of substrates to be processed. The client device assigns a processing chamber to each process in the process sequence for each processing chamber in the integrate substrate processing system. The client device generates a processing model for the batch of substrates. The processing model defines a start time for each substrate in each processing chamber. The client device generates a timetable for the batch of semiconductor substrates based off the processing model. The client device processes the batch of substrates in accordance with the timetable.

20 Claims, 6 Drawing Sheets

(52) U.S. Cl.
CPC .. *H01L 21/67184* (2013.01); *H01L 21/67276* (2013.01); *G05B 2219/32247* (2013.01); *G05B 2219/42155* (2013.01); *G05B 2219/45031* (2013.01); *H01L 21/28185* (2013.01); *H01L 21/67207* (2013.01)

(56) References Cited

U.S. PATENT DOCUMENTS

| | | |
|---|---|---|
| 6,074,443 A | 6/2000 | Venkatesh et al. |
| 6,496,746 B2 | 12/2002 | Jevtic |
| 6,519,498 B1 | 2/2003 | Jevtic et al. |
| 10,359,769 B2 * | 7/2019 | Emani ............... H01L 21/67184 |
| 2002/0055799 A1 | 5/2002 | Lin et al. |
| 2003/0153995 A1 | 8/2003 | Karasawa |
| 2008/0216077 A1 | 9/2008 | Emani et al. |
| 2011/0060441 A1 | 3/2011 | Ko et al. |
| 2013/0073069 A1 | 3/2013 | Yamamoto et al. |
| 2013/0274908 A1 | 10/2013 | Nakata et al. |
| 2015/0268660 A1 | 9/2015 | Hirato |

OTHER PUBLICATIONS

International Search Report and Written Opinion for PCT/US2018/050750 dated Jan. 4, 2019.

\* cited by examiner

US 10,921,793 B2

SUBSTRATE ROUTING AND THROUGHPUT MODELING

CROSS-REFERENCE TO RELATED APPLICATIONS

This application is a continuation of U.S. patent application Ser. No. 15/706,209 filed on Sep. 15, 2017, of which is incorporated by reference in its entirety.

BACKGROUND

Field

Embodiments of the present disclosure generally relate to apparatus and methods for transferring substrates in an integrated processing system. More particularly, embodiments of the present disclosure relate to integrated substrate processing systems having a software sequencer that improves substrate routing and throughput in the integrated processing system.

Description of the Related Art

In semiconductor processing, multi-layered features are fabricated on semiconductor substrates using specific processing recipes having many processing steps. A cluster tool, which integrates a number of process chambers to perform a process sequence without removing substrates from a processing environment (e.g., a controlled environment) is generally used in processing semiconductor substrates. A process sequence is generally defined as the sequence of device fabrication steps, or process recipe steps, completed in one or more processing chambers in a cluster tool. A process sequence may generally contain various substrate electronic device fabrication processing steps.

Cluster tools may include a sequencer that is responsible for moving substrates to different positions, and running processes on the substrates based on the user input. The sequencer is configured to improve substrate movements so that a greater throughput can be achieved. While transferring the substrates in the cluster tool, the sequencer also makes sure that all constraints specified by the process engineers or users are satisfied. conventional approaches are heuristic, i.e., each product is written with custom software code that handles topologies and the most common stats that the cluster tool can find itself in. The problem with this approach is that it is time consuming to write this code for new products, and also take a long time to stabilize.

Accordingly, there is a continual need for a software sequencer that improves substrate routing and throughput in the integrated processing system.

SUMMARY

Embodiments disclosed herein generally relate to methods, systems, and non-transitory computer readable medium for scheduling a substrate processing sequence in an integrated substrate processing system. A client device assigns a processing sequence to each substrate in a batch of substrates to be processed. The client device assigns a processing chamber to each process in the process sequence for each processing chamber in the integrated substrate processing system. The client device generates a processing model for the batch of substrates. The processing model defines a start time for each substrate in each processing chamber. The client device generates a timetable for the batch of substrates based off the processing model. The client device processes the batch of substrates in accordance with the timetable.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 schematically illustrates a cluster tool for substrate processing, according to one embodiment disclosed herein.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
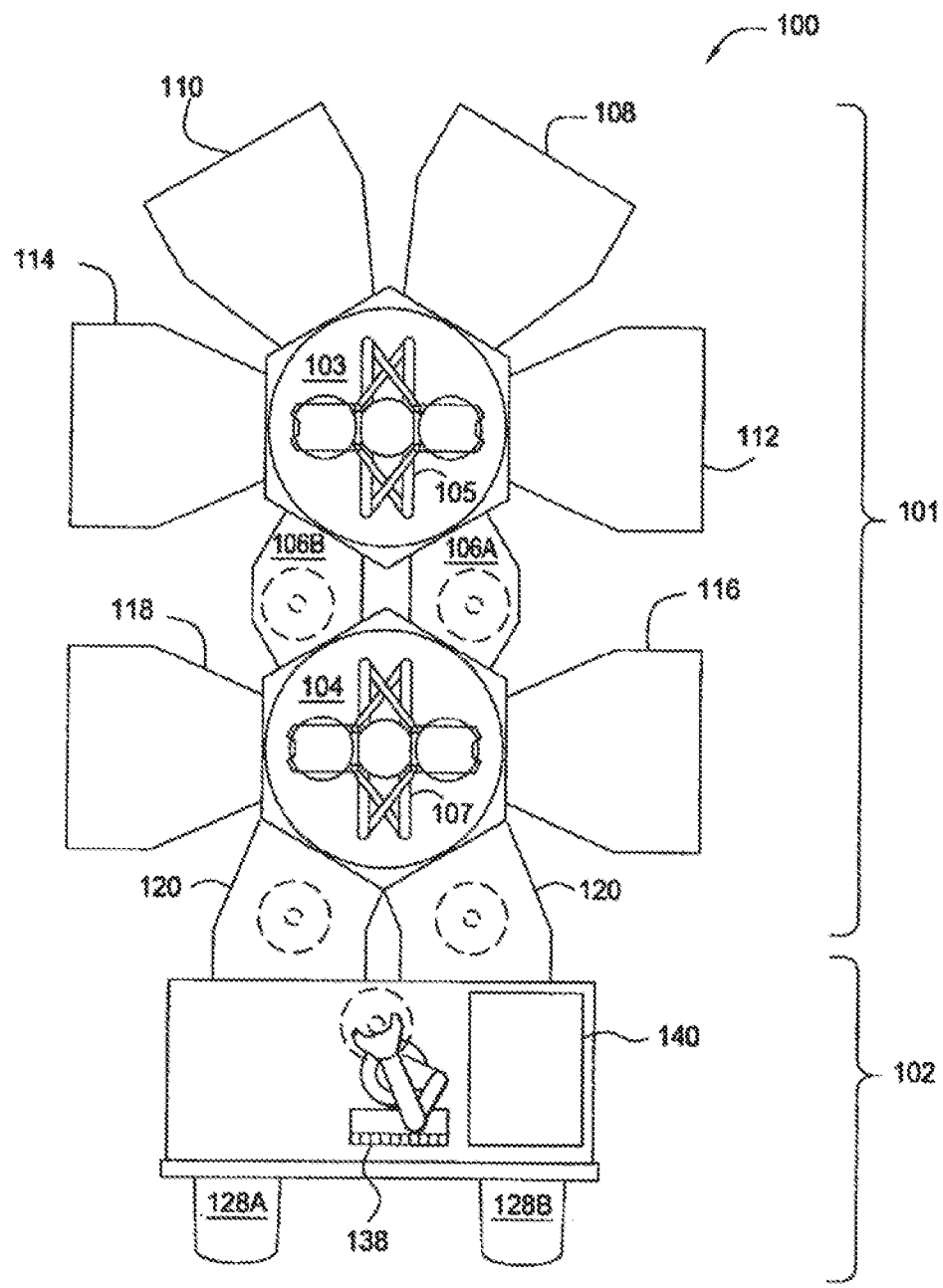

Embodiments of the present disclosure described herein generally relate to a substrate processing sequence. FIG. 1 schematically illustrates a cluster tool 100 for substrate processing, in accordance with one embodiment of the present disclosure. It is contemplated that the method described herein may be practiced in other tools configured to perform a process sequence. For example, the cluster tool 100 embodied in FIG. 1 is the Endura® cluster tool commercially available from Applied Materials, Inc. in Santa Clara, Calif.

The cluster tool 100 includes a vacuum-tight processing platform 101 and a factory interface 102. The platform 101 comprises a plurality of processing chambers 110, 108, 114, 112, 118, 116, and at least one load-lock chamber 120, which are coupled to vacuum substrate transfer chambers 103, 104. The factory interface 102 is coupled to transfer chamber 104 by the load lock chamber 120.

In one embodiment, the factory interface 102 comprises at least one docking station, at least one substrate transfer robot 138, and at least one substrate aligner 140. The docking station is configured to accept one or more front opening unified pods 128 (FOUP). Two FOUPs 128A, 128B are shown in the embodiment of FIG. 1. The substrate transfer robot 138 is configured to transfer the substrate from the factory interface 102 to the load lock chamber 120.

The load lock chamber 120 has a first port coupled to the factory interface 102 and a second port coupled to a first transfer chamber 104. The load lock chamber 120 is coupled to a pressure control system which pumps down and vents the chamber 120 as needed to facilitate passing the substrate between the vacuum environment of the transfer chamber 104 and the substantially ambient (e.g., atmospheric) environment of the factory interface 102.

The first transfer chamber 104 and the second transfer chamber 103 respectively have a first robot 107 and a second robot 105 disposed therein. Two substrate transfer platforms 106A, 106B are disposed in the transfer chamber 104 to facilitate transfer of the substrate between robots 105, 107. The platforms 106A, 106B can either be open to the transfer chambers 103, 104 or be selectively isolated (i.e., sealed) from the transfer chambers 103, 104 to allow different operational pressures to be maintained in each of the transfer chambers 103, 104.

The robot 107 disposed in the first transfer chamber 104 is capable of transferring substrates between the load lock chamber 120, the processing chambers 116, 118, and the substrate transfer platforms 106A, 106B. The robot 105 disposed in the second transfer chamber 103 is capable of transferring substrates between the substrate transfer platforms 106A, 106B and the processing chambers 112, 114, 110, 108.

Figure 2:
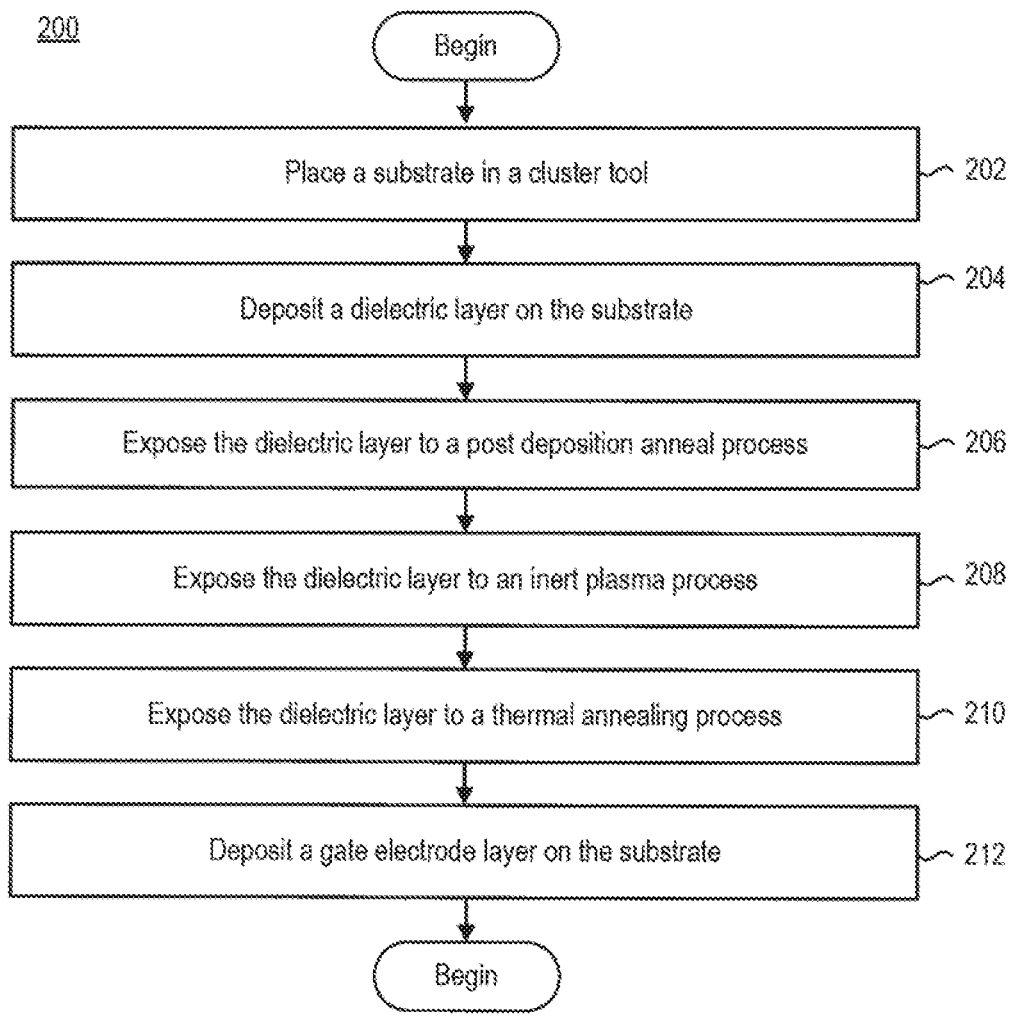
FIG. 2 is a flow diagram of one embodiment of a process sequence for an integrated cluster tool, according to one embodiment disclosed herein.

FIG. 2 illustrates a flow chart of one embodiment of a process sequence 200 for deposition of dielectric layers on a substrate in an integrated cluster tool, such as the cluster tool 100 described above. The process sequence 200 begins at block 202 with positioning a substrate in a cluster tool.

At block 204, a dielectric layer is deposited on the substrate. The dielectric layer may be a metal oxide, and may be deposited by an ALD process, an MOCVD process, a conventional CVD process, or a PVD process. Subsequent to the deposition process, the substrate may be exposed to a post deposition anneal (PDA) process at block 206. The PDA process may be performed in a rapid annealing chamber, such as the Radiance® RTP chamber, commercially available from Applied Materials, Inc. in Santa Clara, Calif.

At block 208, the dielectric layer is exposed to an inert plasma process to densify the dielectric material, thereby forming a plasma-treated layer. The inert plasma process may include a decoupled inert gas plasma process performed by flowing an inert gas into a decoupled plasma nitridation (DPN) chamber.

At block 210, the plasma-treated layer disposed on the substrate is exposed to a thermal annealing process. At block 212, a gate electrode layer is deposited over the annealed dielectric layer. The gate electrode layer may be a polycrystalline-Si, amorphous-Si, or other suitable material, deposited, for example, using an LPCVD chamber.

Methods of the present disclosure relate to determining a process schedule that achieves an improved method of transferring substrate in a cluster tool, such as cluster tool 100. For example, methods of the present disclosure provide a process schedule that achieves an improved scheduling for the method discussed above in conjunction with FIG. 2.

Referring back to FIG. 1, cluster tool 100 may be in communication with a controller 190. The controller 190 may be a controller that aids in controlling the process parameters of each substrate processing chamber 108, 110, 112, 114, 116, and 118 in cluster tool 100. Additionally, the controller 190 may aid in the sequencing and scheduling of the substrates to be processed in the cluster tool 100.

Figure 3:
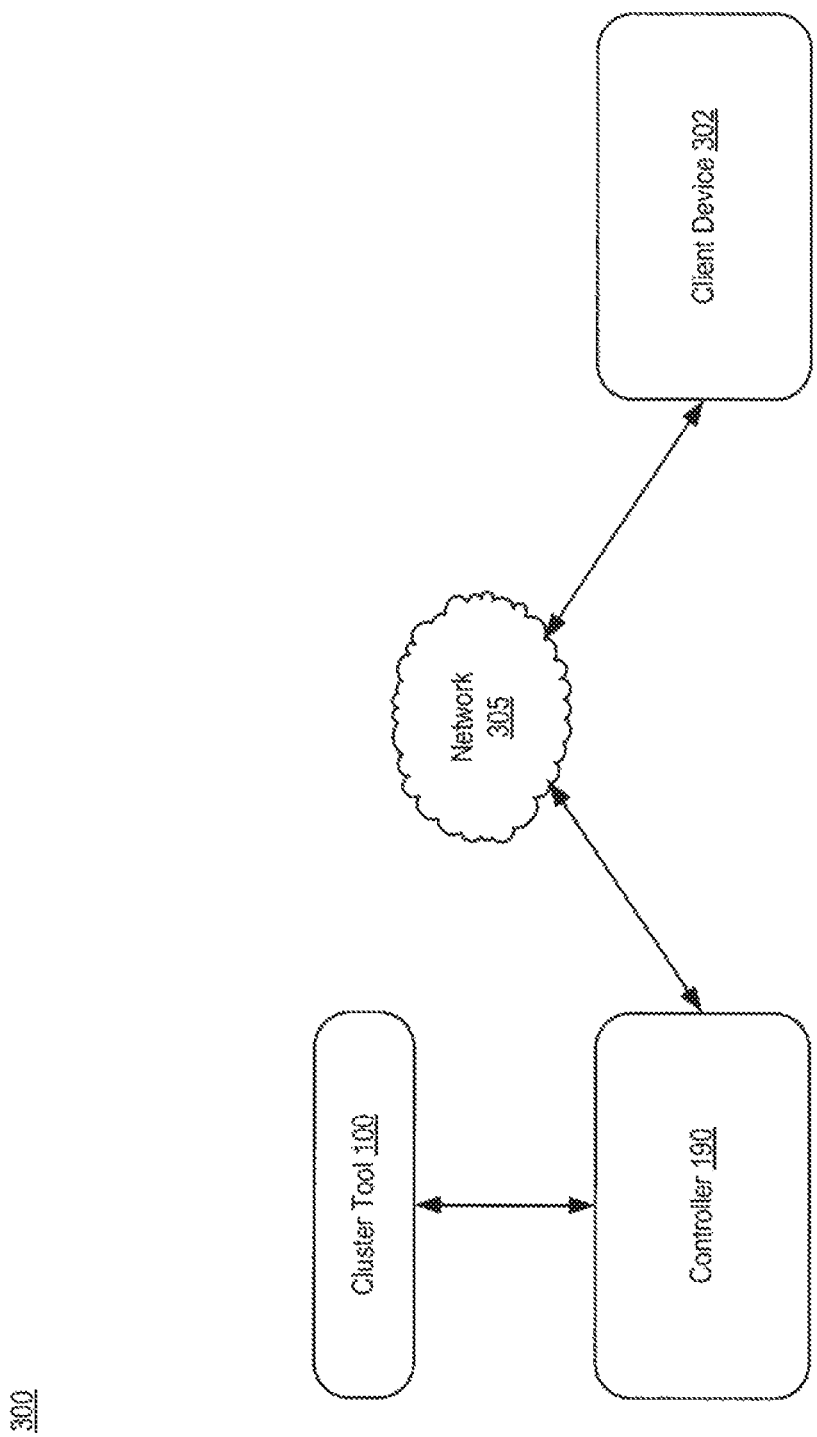
FIG. 3 illustrates a computing environment, according to one embodiment disclosed herein.

FIG. 3 illustrates a computing environment 300, according to one embodiment. The computing environment 300 includes the controller 190 and a client device 302. The controller 190 communicates with client device 302 over network 305. As discussed above in conjunction with FIG. 1, controller 190 is in use with cluster tool 100.

Client device 302 communicates with controller 190 over network 305. For example, client device 302 may generate a process schedule for a batch of substrates to be processed in cluster tool 100. For example, a user may provide to the client device 302 a sequence recipe, which describes what possible processing chambers a substrate will visit at different stages and the process to be run in each chamber. The client device 302 then generates a schedule for the substrate movements so that substrates can be processed in a shorter duration. For example, the client device 302 creates a mathematical model of the cluster tool, and then optimizes the model to provide a solution for an improved way of transferring substrates within the cluster tool, as well as satisfy all the defined constraints of the cluster tool. Client device 302 would then transfer a substrate processing schedule and instructions to the controller 190.

Figure 4:
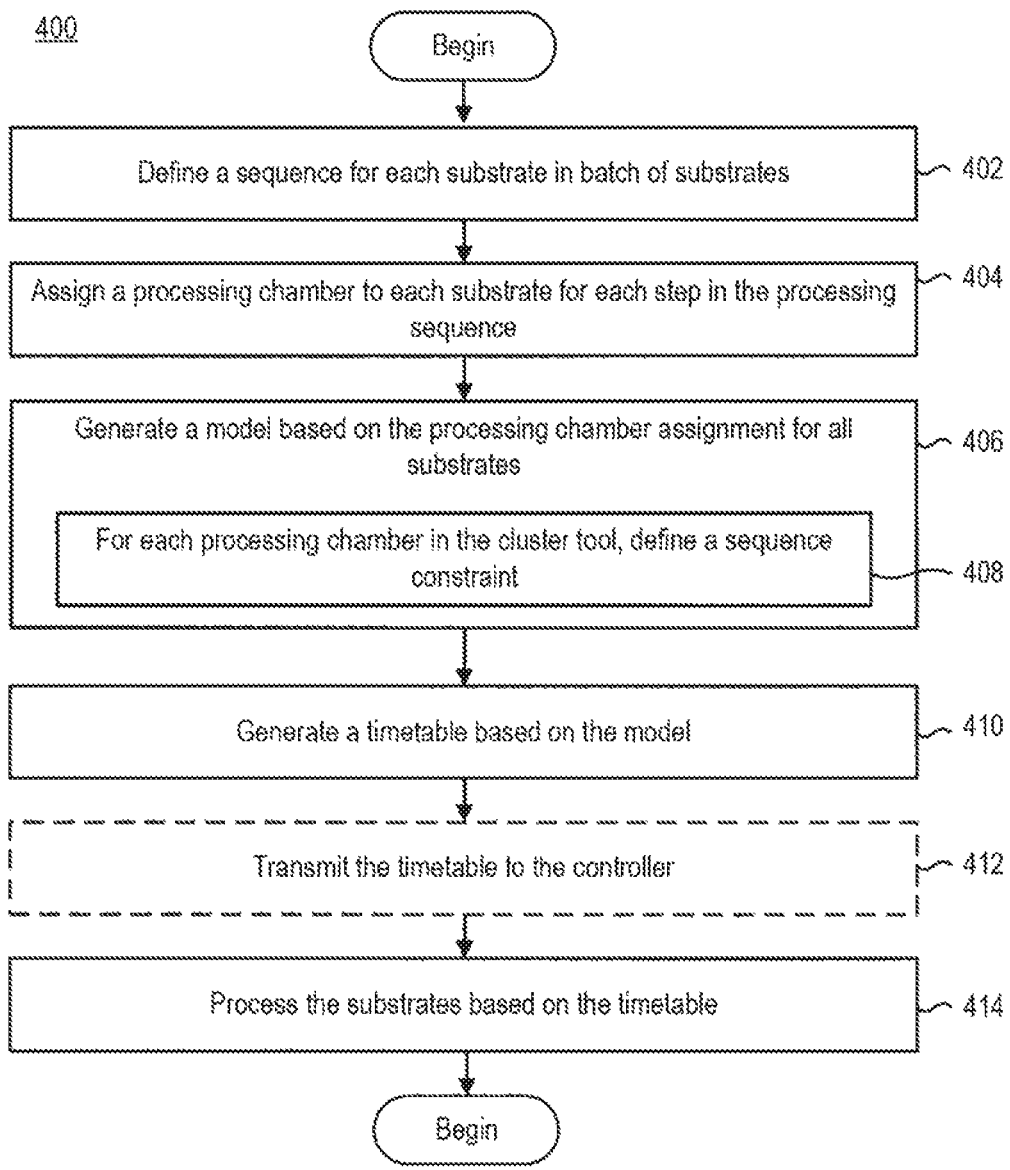
FIG. 4 is a flow diagram of a method of generating a schedule for processing substrates in a cluster tool, according to one embodiment disclosed herein.

FIG. 4 is a flow diagram of a method 400 of generating a schedule for processing substrates in a cluster tool, according to one embodiment. For example, the method 400 may be practiced on the cluster tool 100 discussed above in conjunction with FIG. 1. In other examples, the method 400 may be practiced on other commercially available cluster tools.

The method 400 begins at block 402. At block 402, a sequence for each substrate in a batch of substrates is defined. In one embodiment, client device 302 receives the sequence for each substrate from the user. For example, the user may define a processing sequence as: entry, deposition, anneal, etch, anneal, deposition, exit. Mathematically, the first batch of substrates may be defined as $\{W_i\}$ where i ranges from 1 to n. For the example discussed in FIG. 4, each substrate $W_i$ undergoes the same sequence of steps. The steps in the sequence may be represented mathematically as $\{s_i\}$ where i ranges from 1 to n. Thus, each substrate $W_i$ undergoes each step $s_i$ in the sequence defined in block 402.

At block 404, client device 302 assigns a processing chamber to each substrate for each step in the processing sequence. For example, referring to FIG. 1, suitable chambers may be chosen from chambers 108, 110, 112, 114, 116, and 118 to facilitate the process sequence defined above at block 402. In a specific example, the chambers 116, 118 may be a chemical vapor deposition (CVD) chamber; the chambers 108, 114 may be a decoupled plasma nitridation (DPN) chamber; the chambers 110, 112 may be a rapid thermal process (RTP) chamber. One or more cool down chambers may be positioned above the substrate transfer platform 106A, 106B. Accordingly, upon determining the arrangement in the cluster tool 100, client device 302 may allocate chambers, load locks, and robots for each process step in the processing sequence and transitions between steps.

At block 406, client device 302 generates a processing model for the batch of substrates. Client device 302 may generate the processing model based off the assignment of processing chambers discussed above at block 404. Generally, each substrate, $W_x$ starts at a time, $T_x$. The process duration of each sequence step, $s_t$ is defined as $D_s$ where s is the step number of the sequence. For example, $D_3$ is the process time of sequence step $s_3$. Generally, a substrate may wait in the process chamber after the process in that process chamber has finished. The wait time is defined as $Q_{xs}$, where x is the substrate number and s is the sequence step number.

For example, $Q_{21}$ is interpreted as the wait time of substrate $W_2$ at sequence step $s_1$. Given the preceding definitions, substrate $W_1$ starts step $s_1$ at a time equal to $T_x+D_1+Q_{11}$. Generalizing, substrate $W_1$ will start any step $s_i$ at a time equal to:

$$T_x + \sum_{j=1}^{s-1} D_j + \sum_{j=1}^{s-1} Q_{1j}$$

Block 406 includes sub-block 408. At sub-block 408, for each processing chamber in the cluster tool 100, the client device 302 defines a sequence constraint. The sequence constraints aid in the objective of decreasing, or ultimately minimizing, the time taken to process all of the substrates in the batch of substrates. Intuitively, this would mean that the controller 190 would send the substrates into the cluster tool 100 as quickly as possible, and retrieve the substrates from the cluster tool 100. To do so, the client device 302 leverages the principle of linear optimization for generating the process model.

Linear optimization is a method of achieving the "best" outcome (e.g., shortest process time) in a mathematical model whose requirements are represented by linear relationships. Mathematically, this may be represented as:
Minimize:

$$\sum_{i=1}^{n} C_1 X_1$$

Subject to:

$$A_{11}X_1 + A_{12}X_2 + A_{13}X_3 + \ldots \le B_1$$
$$A_{21}X_1 + A_{22}X_2 + A_{23}X_3 + \ldots \le B_2$$
$$\ldots$$
$$A_{m1}X_1 + A_{m2}X_2 + A_{m3}X_3 + \ldots \le B_m$$

where $X_i$ are variables, $\{A_{mn}\} \in \mathbb{Q}$, $\{B_i\} \in \mathbb{Q}$, and $\{C_i\} \in \mathbb{Q}$.

Applying this principle to the above, the client device minimizes:

$$\sum_{i=1}^{n} A_i T_i + \sum_{j=1}^{N} \sum_{k=1}^{m} B_j Q_{jk}$$

where $A_i$, $B_j$ are weights that may be applied to the start time variables $T_i$ and the wait times $Q_{jk}$, respectively. For example, the weights may be directed to additional features of the semiconductor manufacturing process. In one embodiment, the weights may be adjusted responsive to a cleaning process to be run after a substrate is finished processing in a processing chamber. In another embodiment, the weights may be adjusted responsive to "dummy" substrate movement throughout the cluster tool 100. In another embodiment, the weights may be adjusted responsive to whether the robot is a single blade robot or a dual blade robot. In another embodiment, the weights may be adjusted responsive to a processing chamber being a batch processing chamber, i.e., the processing chamber is capable of processing two or more substrates at once. In yet another embodiment, the weights may be adjusted responsive to a substrate processing sequence requiring the substrate to revisit a certain processing chamber.

Generally, the constraints may be defined as a given substrate cannot enter a given processing chamber until the previous substrate has completed processing. Mathematically, assume there are two substrates, $W_x$, $W_y$, that use the same processing chamber at sequence step $s_s$. $W_x$ arrives at the chamber before $W_y$. Accordingly, the start time for $W_y$ is greater than the start time of $W_x$+Duration of step $s_s$+$W_x$ wait time after step $s_s$. Using the definition in block 404 of start time, the constraint may be represented as:

$$T_x + \sum_{j=1}^{s-1} D_j + \sum_{j=1}^{s-1} Q_{xj} + D_s \le T_y + \sum_{j=1}^{s-1} D_j + \sum_{j=1}^{s-1} Q_{yj}$$

Thus, $\sum_{i=1}^{n} A_i T_i + \sum_{j=1}^{N} \sum_{k=1}^{m} B_j Q_{jk}$ is minimized subject to $T_x + \sum_{j=1}^{s-1} D_j + \sum_{j=1}^{s-1} Q_{xj} + D_s \le T_y + \sum_{j=1}^{s-1} D_j + \sum_{j=1}^{s-1} Q_{yj}$ for each processing chamber that is used in the sequence step and every consecutive substrate pair, i.e. for each (x,y), where $W_x$, $W_y$ use the same processing chamber at sequence step $s_s$ consecutively.

Accordingly, the client device 108 generates the processing model for all substrates in the batch based on all the sequence constraints simultaneously. The client device 302 is able to generate the processing model at once because each substrate is assigned the same processing sequence.

At block 410, client device 302 generates a timetable for the batch of substrates based off the model generated in block 206. For example, the timetable includes the start time $T_x$ of each substrate, and the order of substrate processing at each processing chamber.

At block 412, optionally, the client device 302 transmits the timetable to the controller 190. In those embodiments in which the client device 302 and the controller are one in the same, client device 302 does not need to transmit the timetable. At block 414, client device 302 (or controller 190) begins substrate processing based off the timetable.

Figure 5:
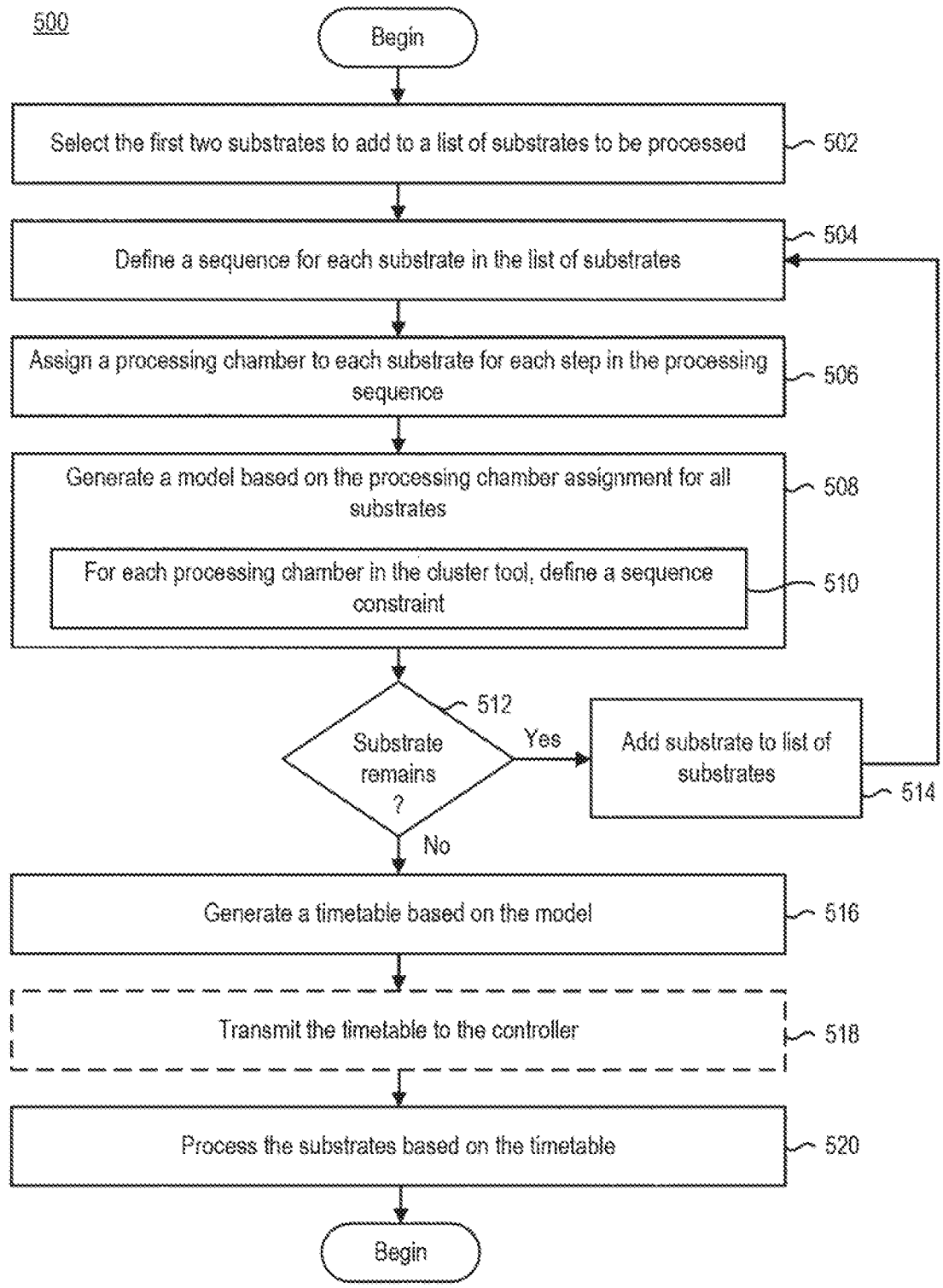
FIG. 5 is a flow diagram of a method of generating a schedule for processing substrates in a cluster tool, according to one embodiment disclosed herein.

FIG. 5 is a flow diagram of a method 500 of generating a schedule for processing substrates in a cluster tool, according to one embodiment. For example, the method 500 may be practiced on the cluster tool 100 discussed above in conjunction with FIG. 1. In other examples, the method 500 may be practiced on other commercially available cluster tools. For the example discussed in FIG. 5, not all substrates W undergo the same sequence of steps.

The method 500 begins at block 502. At block 502, two substrates are chosen to enter the cluster tool 100. For example, $W_x$, $W_y$ are the first two substrates chosen to enter the processing chamber. At block 504, a sequence for each substrate chosen to enter the cluster tool is defined. In one embodiment, client device 302 receives the sequence for each substrate from the user. For example, the user may define a processing sequence as: entry, deposition, anneal, etch, anneal, deposition, exit. The steps in the sequence may be represented mathematically as $\{s_i\}$ where i ranges from 1 to n. Thus, $W_x$ includes the $\{s_i\}$, and $W_y$ includes the set of steps $\{s_j\}$ such that an element of $\{s_i\}$ is not equal to an element of $\{s_j\}$.

At block 506, client device 302 assigns a processing chamber to each substrate entering the cluster tool 100 for each step in the processing sequence. For example, referring to FIG. 1, suitable chambers may be chosen from chambers 108, 110, 112, 114, 116, and 118 to facilitate the process sequence defined above at block 402. In a specific example, the chambers 116, 118 may be a chemical vapor deposition (CVD) chamber; the chambers 108, 114 may be a decoupled plasma nitridation (DPN) chamber; the chambers 110, 112 may be a rapid thermal process (RTP) chamber. One or more cool down chambers may be positioned above the substrate transfer platform 106A, 106B. Accordingly, for $W_x$, client device 302 assigns a processing chamber to each step in the set $\{s_i\}$, and for $W_y$, client device 302 assigns a processing chamber to each step in the set $\{s_j\}$. Thus, upon determining the arrangement in the cluster tool 100, client device 302 may allocate chambers, load locks, and robots for each process step in the processing sequence and transitions between steps for $W_x$, $W_y$.

At block 508, client device 302 generates a model based on the processing chamber assignment for all substrates selected to enter the cluster tool 100. For example, client device 302 generates a model based on the processing chamber assignment for substrates $W_x$, $W_y$.

Block 508 includes sub-block 510. At sub-block 510, for each processing chamber in the cluster tool 100, the client device 302 defines a sequence constraint. The sequence constraints aid in the objective of decreasing, or ultimately minimizing, the time taken to process all of the substrates in the batch of substrates. Intuitively, this would mean that the controller 190 would send the substrates into the cluster tool 100 as quickly as possible, and retrieve the substrates from the cluster tool 100. To do so, the client device 302 leverages the principle of linear optimization for generating the process model.

For example, client device 302 generates a sequence constraint for each processing chamber in the cluster tool 100 that substrates $W_x$, $W_y$ will travel do during their processing sequences. Client device 302 generates the sequence constraints in accordance with the methods discussed above in conjunction with block 408 of FIG. 4.

The difference between the method discussed above in conjunction with FIG. 4 and the method discussed in FIG. 5 is that in FIG. 5, the sequence for each substrate in the batch of substrates is not the same. Accordingly, the client device 302 generates the timetable for processing piecewise, by starting with two substrates (i.e., $W_x, W_y$) and adding an additional substrate (e.g., $W_z$) until all substrates in the batch are added. Accordingly, at block 512, the client device 302 determines whether there are any substrates remaining the batch of substrates to be analyzed. If there are substrates remaining in the batch of substrates to be analyzed, at block 514, the client device 302 adds a substrate (e.g., $W_z$) to the list of substrates to be processed, i.e., client device 302 adds $W_z$ to the substrates $W_x$, $W_y$ to be processed. The method 500 then reverts to block 504, for analysis with substrates $W_x$, $W_y$, $W_z$.

If, however, at block 512, the client device 302 determines that there are no substrates in the batch of substrates remaining, then at block 516, the client device 302 generates a timetable for the batch of substrates based off the model generated in block 508. For example, the timetable includes the start time $T_x$ of each substrate, and the order of substrate processing at each processing chamber.

At block 518, optionally, the client device 302 transmits the timetable to the controller 190. In those embodiment in which the client device 302 and the controller are one in the same, client device 302 does not need to transmit the timetable. At block 520, client device 302 (or controller 190) begins substrate processing based off the timetable.

Figure 6:
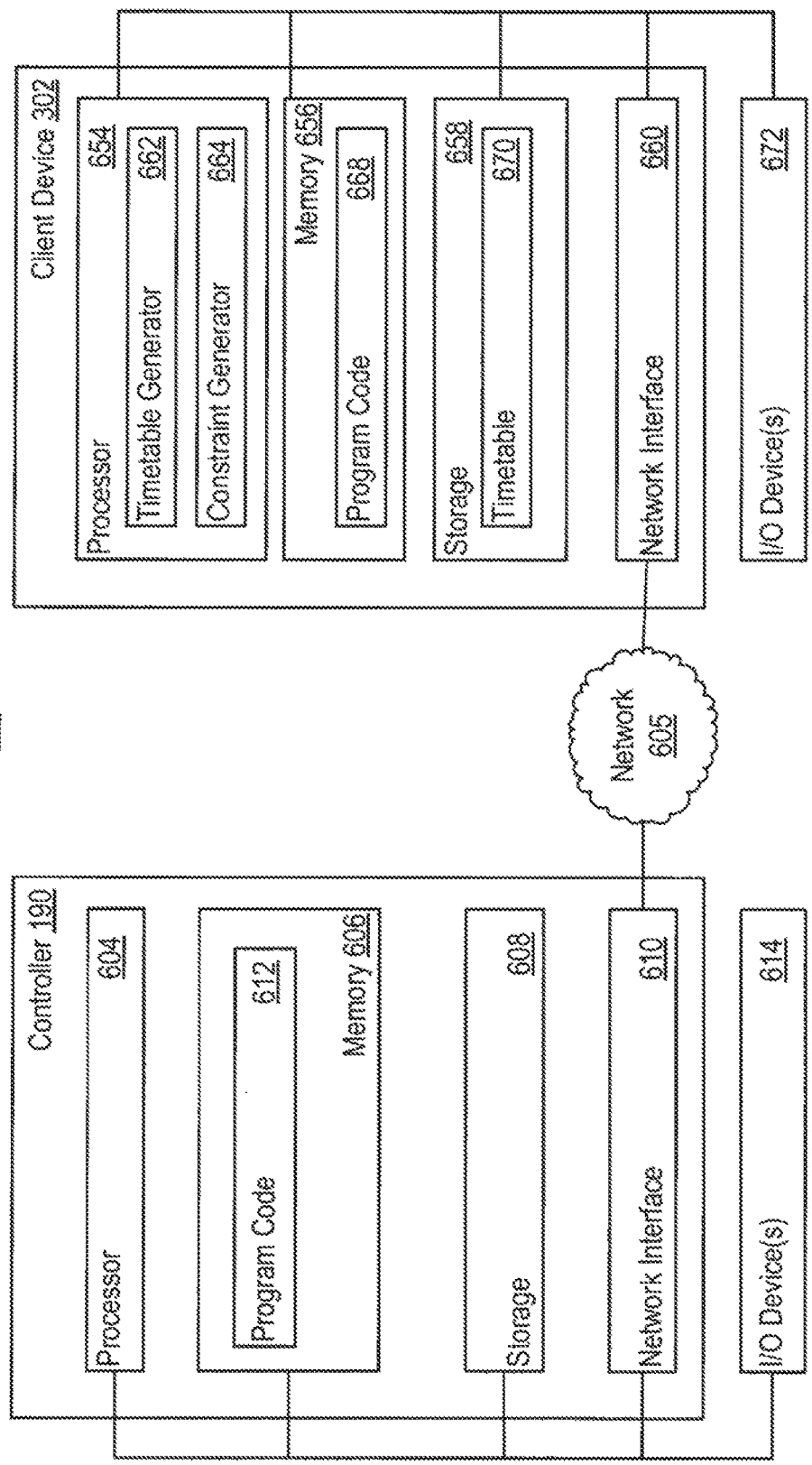
FIG. 6 illustrates a computing platform, according to one embodiment disclosed herein.

FIG. 6 illustrates a computing platform 600, according to one embodiment. Computing platform 600 includes controller 190 and client device 302. Controller 190 includes a processor 604, a memory 606, storage 608, and network interface 610. In some embodiments, the client device 302 may further include one or more I/O devices 614 coupled thereto. The processor 604 retrieves and executes programming instructions, such as program code 612, stored in memory 606. The processor 604 is included to be representative of a single processor, multiple processors, a single processor having multiple processing cores, and the like.

The storage 608 may be a disk drive storage. Although shown as a single unit, the storage 608 may be a combination of fixed and/or removable storage devices, such as fixed disk drives, removable memory cards, optical storage, network attached storage (NAS), or storage-area-network (SAN). The network interface 610 may be any type of network communications allowing the controller 190 to communicate with other computers via network 605, such as, for example, client device 302.

The client device 302 includes a processor 654, a memory 656, storage 658, and network interface 660. In some embodiments, the client device 302 may further include one or more I/O devices 672 coupled thereto. The processor 654 is included to be representative of a single processor, multiple processors, a single processor having multiple processing cores, and the like.

The processor 654 may include a timetable generator 662 and a constraint generator 664. The constraint generator 664 is configured to assign a processing chamber to each substrate for each step in the processing sequence, and, subsequently, generate a model based on the processing chamber assignment. For example, constraint generator 664 may be configured to carry out the processes of one or more blocks discussed above in conjunction with either FIG. 4 or FIG. 5. The timetable generator 662 is configured to generate a processing timetable based off the generated constraints. For example, the timetable generator 662 may be configured to carry out the processes discussed above in accordance with block 518 in FIG. 5 or block 410 in FIG. 4. The generated timetables may be stored in storage 658. For example, timetable 670 may be in storage 658.

The memory 656 includes program code 668. The program code 668 is configured to carry out the instructions of generating a processing schedule for a batch of substrates. For example, the program code 668 may include the methods discussed above in conjunction with FIGS. 4 and 5.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of program product define functions of the embodiments (including the methods described herein) and can be contained on a variety of computer-readable storage media. illustrative computer-readable storage media include, but are not limited to: (i) non-writable storage media (for example, read-only memory devices within a computer such as CD-ROM disks readable by CD-ROM drive, flash memory, ROM chips, or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings and included within the true spirit and scope of the present disclosure. It is therefore intended that the following appended claims include all such modifications, permutations, and equivalents as fall within the true spirit and scope of these teachings.

While the foregoing is directed to embodiments of the present invention, other and further embodiments of the invention may be devised without departing from the basic scope thereof, and the scope thereof is determined by the claims that follow.

What is claimed:

1. A method of routing a semiconductor substrate for processing in an integrated substrate processing system, comprising:
    assigning a sequence of processes to be performed to each semiconductor substrate in a batch of semiconductor substrates;
    for each processing chamber in the integrated substrate processing system, assigning a processing chamber to each process of the sequence of processes in the batch of semiconductor substrates;
    generating a processing model for the batch of semiconductor substrates based on the processing chamber assignments;
    generating a timetable for the batch of semiconductor substrates based off the processing model; and
    processing the batch of semiconductor substrates in accordance with the timetable.

2. The method of claim 1, wherein the processing sequence is the same for each semiconductor substrate in the batch.

3. The method of claim 1, wherein the processing sequence is not the same for each semiconductor substrate in the batch.

4. The method of claim 3, wherein assigning the processing sequence to each semiconductor substrate in the batch of semiconductor substrates to be processed, comprises:
    selecting a first semiconductor substrate and a second semiconductor substrate to add to a list of semiconductor substrates to be processed; and
    assigning a first processing sequence to the first semiconductor substrate and a second processing sequence to the second semiconductor substrate.

5. The method of claim 4, wherein generating the processing model for the batch of semiconductor substrates, comprises:
    generating a processing model for the first semiconductor substrate and the second semiconductor substrate.

6. The method of claim 5, further comprising:
    identifying an additional semiconductor substrate in the batch to be processed;
    upon identifying the additional semiconductor substrate, adding the additional semiconductor substrate to the list of substrates to be processed; and
    generating a processing model for the list of semiconductor substrates to be processed.

7. The method of claim 1, wherein generating a processing model for the batch of semiconductor substrates, comprises:
    defining a sequence constraint for each processing chamber in the integrated substrate processing system.

8. A system, comprising:
    a processor; and
    a memory having instructions stored thereon, which, when executed by the processor, performs an operation for scheduling a semiconductor substrate processing sequence in an integrated substrate processing system, the operation comprising:
        assigning a sequence of processes to be performed to each semiconductor substrate in a batch of semiconductor substrates to be processed;
        for each processing chamber in the integrated substrate processing system, assigning a processing chamber to each process of the sequence of processes in the batch of semiconductor substrates;
        generating a processing model for the batch of semiconductor substrates, based on the processing chamber assignments;
        generating a timetable for the batch of semiconductor substrates based off the processing model; and
        processing the batch of semiconductor substrates in accordance with the timetable.

9. The system of claim 8, wherein the processing sequence is the same for each semiconductor substrate in the batch.

10. The system of claim 8, wherein the processing sequence is not the same for each semiconductor substrate in the batch.

11. The system of claim 10, wherein assigning the processing sequence to each semiconductor substrate in the batch of semiconductor substrates to be processed, comprises:
    selecting a first semiconductor substrate and a second semiconductor substrate to add to a list of semiconductor substrates to be processed; and
    assigning a first processing sequence to the first semiconductor substrate and a second processing sequence to the second semiconductor substrate.

12. The system of claim 11, wherein generating the processing model for the batch of semiconductor substrates, comprises:
    generating a processing model for the first semiconductor substrate and the second semiconductor substrate.

13. The system of claim 12, further comprising:
    identifying an additional semiconductor substrate in the batch to be processed;
    upon identifying the additional semiconductor substrate, adding the additional semiconductor substrate to the list of substrates to be processed; and
    generating a processing model for the list of semiconductor substrates to be processed.

14. The system of claim 8, wherein generating a processing model for the batch of semiconductor substrates, comprises:
    defining a sequence constraint for each processing chamber in the integrated substrate processing system.

15. A non-transitory computer readable medium having instructions stored thereon, which, when executed by a processor, cause the processor to perform a method of scheduling a semiconductor substrate processing sequence in an integrated substrate processing system, comprising:

assigning a sequence of processes to be performed to each semiconductor substrate in a batch of semiconductor substrates;

for each processing chamber in the integrated substrate processing system, assigning a processing chamber to each process of the sequence of processes in the batch of semiconductor substrates;

generating a processing model for the batch of semiconductor substrates based on the processing chamber assignments;

generating a timetable for the batch of semiconductor substrates based off the processing model; and processing the batch of semiconductor substrates in accordance with the timetable.

16. The non-transitory computer readable medium of claim 15, wherein the processing sequence is the same for each semiconductor substrate in the batch.

17. The non-transitory computer readable medium of claim 15, wherein the processing sequence is not the same for each semiconductor substrate in the batch.

18. The non-transitory computer readable medium of claim 17, wherein assigning the processing sequence to each semiconductor substrate in the batch of semiconductor substrates to be processed, comprises:

selecting a first semiconductor substrate and a second semiconductor substrate to add to a list of semiconductor substrates to be processed; and assigning a first processing sequence to the first semiconductor substrate and a second processing sequence to the second semiconductor substrate.

19. The non-transitory computer readable medium of claim 18, wherein generating the processing model for the batch of semiconductor substrates, comprises:

generating a processing model for the first semiconductor substrate and the second semiconductor substrate.

20. The non-transitory computer readable medium of claim 19, further comprising:

identifying an additional semiconductor substrate in the batch to be processed;

upon identifying the additional semiconductor substrate, adding the additional semiconductor substrate to the list of substrates to be processed; and generating a processing model for the list of semiconductor substrates to be processed.

* * * * *